US011631567B2

(12) United States Patent
Koo et al.

(10) Patent No.: US 11,631,567 B2
(45) Date of Patent: *Apr. 18, 2023

(54) ION SOURCE WITH SINGLE-SLOT TUBULAR CATHODE

(71) Applicant: Applied Materials, Inc., Santa Clara, CA (US)

(72) Inventors: Bon-Woong Koo, Andover, MA (US); Frank Sinclair, Boston, MA (US); Alexandre Likhanskii, Malden, MA (US); Svetlana Radovanov, Brookline, MA (US); Alexander Perel, Danvers, MA (US); Graham Wright, Gloucester, MA (US); Jay T. Scheuer, Rowley, MA (US); Daniel Tieger, Manchester, MA (US); You Chia Li, Reading, MA (US); Jay Johnson, Gloucester, MA (US); Tseh-Jen Hsieh, Rowley, MA (US); Ronald Johnson, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 109 days.

This patent is subject to a terminal disclaimer.

(21) Appl. No.: 17/407,714

(22) Filed: Aug. 20, 2021

(65) Prior Publication Data
US 2021/0383995 A1 Dec. 9, 2021

Related U.S. Application Data

(63) Continuation-in-part of application No. 16/817,500, filed on Mar. 12, 2020, now Pat. No. 11,127,557.

(51) Int. Cl.
*H01J 27/02* (2006.01)
*H01J 37/317* (2006.01)

(52) U.S. Cl.
CPC .......... *H01J 27/022* (2013.01); *H01J 37/317* (2013.01); *H01J 2237/31701* (2013.01)

(58) Field of Classification Search
CPC .................. H01J 27/022; H01J 37/317; H01J 2237/31701; H01J 2237/061;
(Continued)

(56) References Cited

U.S. PATENT DOCUMENTS 4,774,437 A 9/1988 Helmer et al.
5,262,652 A 11/1993 Bright et al.
(Continued)

FOREIGN PATENT DOCUMENTS

CN 1460130 A 12/2003
JP 2015-170451 A 9/2015
WO 2014-164111 A1 10/2014

OTHER PUBLICATIONS

International Search Report dated Jun. 7, 2021, for the International Patent Application No. PCT/US2021/017608, filed on Feb. 11, 2021, 3 pages.
(Continued)

*Primary Examiner* — David A Vanore
(74) *Attorney, Agent, or Firm* — KDW Firm PLLC (57) ABSTRACT

An ion source including a chamber housing defining an ion source chamber and including an extraction plate on a front side thereof, the extraction plate having an extraction aperture formed therein, and a tubular cathode disposed within the ion source chamber and having an opening formed in a front half thereof nearest the extraction aperture, wherein a rear half of the tubular cathode furthest from the extraction aperture is closed.

18 Claims, 6 Drawing Sheets

(58) Field of Classification Search
CPC ...... H01J 2237/082; H01J 27/08; H01J 37/08; H01J 37/3171; H01J 27/024
See application file for complete search history.

(56) References Cited

U.S. PATENT DOCUMENTS

| | | | |
|---|---|---|---|
| 5,763,890 | A | 6/1998 | Cloutier et al. |
| 7,102,139 | B2 | 9/2006 | Low et al. |
| 7,276,847 | B2 | 10/2007 | Olson et al. |
| 9,543,110 | B2 | 1/2017 | Colvin et al. |
| 10,748,738 | B1 | 8/2020 | Koo et al. |
| 11,127,557 | B1 * | 9/2021 | Koo ................. H01J 37/3171 |
| 2003/0197129 | A1 | 10/2003 | Murrell et al. |
| 2014/0042022 | A1 | 2/2014 | Xu et al. |
| 2018/0254166 | A1 | 9/2018 | Kawaguchi |
| 2020/0343071 | A1 | 10/2020 | Koo et al. |

OTHER PUBLICATIONS

Written Opinion dated Jun. 7, 2021, for the International Patent Application No. PCT/US2021/017608, filed on Feb. 11, 2021, 4 pages.

* cited by examiner

ION SOURCE WITH SINGLE-SLOT TUBULAR CATHODE

CROSS REFERENCES TO RELATED APPLICATIONS

This application is a continuation-in-part of U.S. Non-Provisional patent application Ser. No. 16/817,500, filed Mar. 12, 2020, which is incorporated by reference herein in its entirety.

FIELD OF THE DISCLOSURE

The disclosure relates generally to ion sources, and more particularly to an ion source having a tubular cathode with a single slot.

BACKGROUND OF THE DISCLOSURE

Ion implantation is a process of introducing dopants or impurities into a substrate via ion bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile often provides improved IC performance. To achieve a particular doping profile, one or more dopants may be implanted in the form of ions in various doses and various energy levels.

The beam line components of an ion implanter may include a series of electrodes configured to extract ions from a source chamber, a mass analyzer configured with a particular magnetic field where just ions having a desired mass-to-charge ratio are allowed to pass through the analyzer, and a corrector magnet configured to provide a ribbon beam directed to the platen to implant the ions into a target substrate. The ions lose energy when the ions collide with nuclei and electrons in the substrate and come to rest at a desired depth within the substrate based on the acceleration energy. The depth of implantation into the substrate is a function of ion energy and the mass of the ions generated in the source chamber. In some approaches, arsenic or phosphorus may be doped to form n-type regions in a substrate, and boron, gallium, or indium may be doped to create p-type regions in a substrate.

Various types of ion sources may be employed for ionizing feed gases. Such sources may be selected based on the type of plasma intended as well as an associated ion beam profile for implantation into a target substrate. One type of ion source is a hot-cathode ion source utilizing an indirectly heated cathode (IHC) to ionize a feed gas in a source chamber. IHC ion sources may generate a variety of ion species including dopant ions (e.g. $B^+$, $P^+$, $As^+$) used for implantation into semiconductor substrates to control electronic properties of the semiconductor substrates. A persistent challenge with IHC ion sources is the improvement of molecular ion beam currents, particularly $P_2^+$ dimer and $BF_2^+$ beam current.

With respect to these and other considerations the present improvements have been needed.

SUMMARY

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

An ion source in accordance with an exemplary embodiment of the present disclosure may include a chamber housing defining an ion source chamber and including an extraction plate on a front side thereof, the extraction plate having an extraction aperture formed therein, and a tubular cathode disposed within the ion source chamber and having an opening formed in a front half thereof nearest the extraction aperture, wherein a rear half of the tubular cathode furthest from the extraction aperture is closed.

An ion source in accordance with another exemplary embodiment of the present disclosure may include a chamber housing defining an ion source chamber and including an extraction plate on a front side thereof, the extraction plate having an extraction aperture formed therein, a tubular cathode disposed within the ion source chamber and having an opening formed in a front half thereof nearest the extraction aperture, wherein a rear half of the tubular cathode furthest from the extraction aperture is closed. The opening may have an angular size in a range of 10 degrees to 180 degrees relative to an axial cross-section of a main body of the tubular cathode. A shortest distance between a main body of tubular cathode and the extraction aperture is in a range of 2 millimeters to 10 millimeters.

An ion source in accordance with another exemplary embodiment of the present disclosure may include a chamber housing defining an ion source chamber and having an extraction plate on a front side thereof and a gas inlet in a rear side thereof, the extraction plate having an extraction aperture formed therein. The ion source may further include a tubular cathode disposed within the ion source chamber between the extraction plate and the gas inlet, the tubular cathode having an opening formed in a front half thereof nearest the extraction aperture, wherein a rear half of the tubular cathode furthest from the extraction aperture is closed. The ion source may further include a thermal break in the chamber housing adjacent the ion source chamber for mitigating temperature variations at an interior surface of the chamber housing.

A method of manufacturing an ion source in accordance with an exemplary embodiment of the present disclosure may include providing a chamber housing defining an ion source chamber and including an extraction plate on a front side thereof, the extraction plate having an extraction aperture formed therein, and disposing a tubular cathode within the ion source chamber, the tubular cathode having an opening formed in a front-half thereof nearest the extraction aperture, the opening disposed in a confronting relationship with the extraction aperture, wherein a rear half of the tubular cathode furthest from the extraction aperture is closed.

The drawings are not necessarily to scale. The drawings are merely representations, not intended to portray specific parameters of the disclosure. The drawings are intended to depict example embodiments of the disclosure, and thus are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

An ion source in accordance with the present disclosure will now be described more fully hereinafter with reference to the accompanying drawings, where non-limiting embodiments of the ion source are shown. The ion source may be embodied in many different forms and are not to be construed as being limited to the embodiments set forth herein. Instead, these embodiments are provided so the disclosure will be thorough and complete, and will fully convey the scope of the ion source to those skilled in the art.

Provided herein are embodiments of an ion source with improved molecular ion beam currents. Specifically, embodiments of an ion source having a single-slot tubular cathode are provided for facilitating larger beam currents of molecular ion species, such as phosphorous dimer, trimer and tetramer and $BF_2^+$, for a given extraction current, relative to ion sources having conventional cathode arrangements. Thus, the ion source of the present disclosure may achieve greater throughput and/or increased maintenance intervals.

Figure 1A:
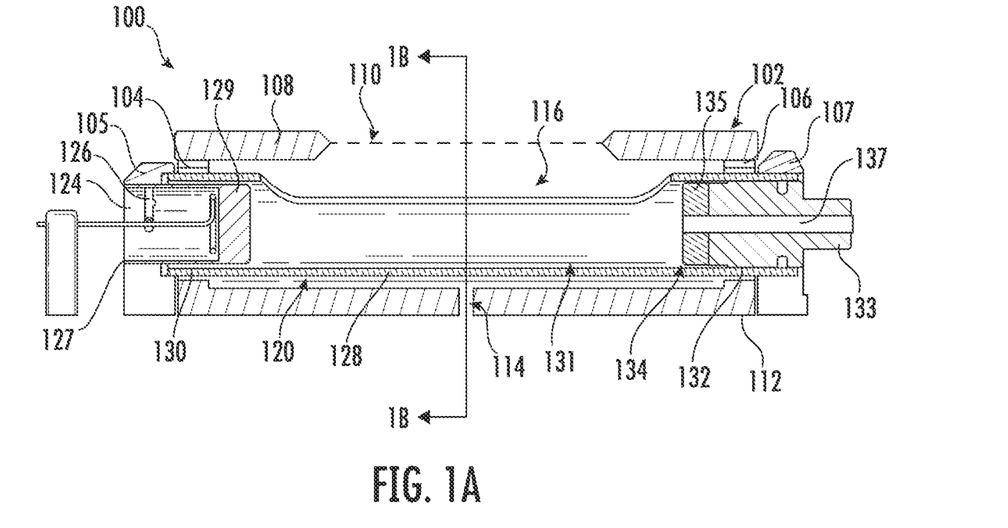
FIG. 1A is a longitudinal cross-sectional view illustrating an ion source in accordance with an embodiment of the present disclosure.
Figure 1B:
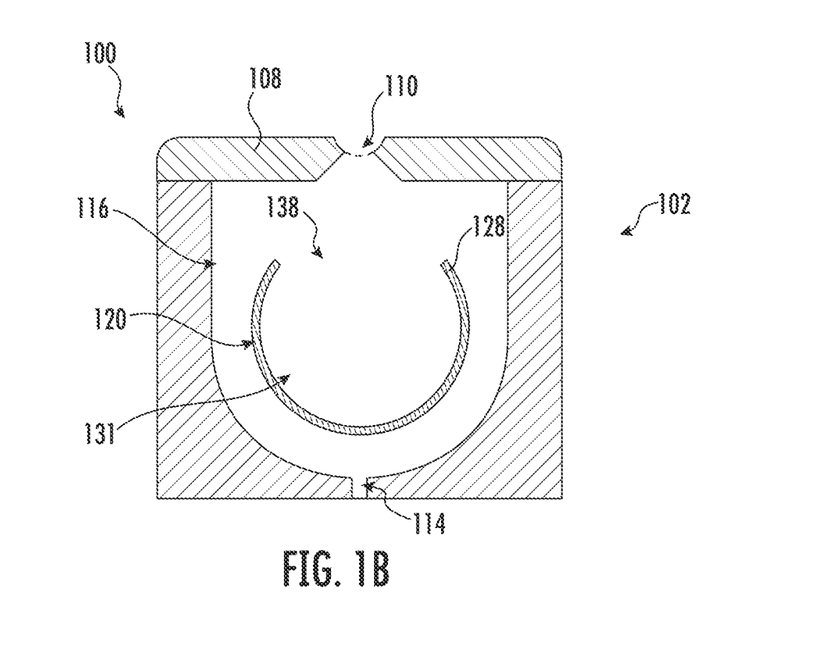
FIG. 1B is an axial cross-sectional view of the ion source shown in FIG. 1A.

Referring now to FIGS. 1A and 1B, a longitudinal cross-sectional view and an axial cross-sectional view illustrating an ion source 100 in accordance with an exemplary embodiment of the present disclosure is shown. For the sake of convenience and clarity, terms such as "front," "rear," "lateral," "longitudinal," "axial," and "radial," may be used below to describe the relative placement and orientation of various components of the ion source 100, all with respect to the geometry and orientation of the ion source 100 as the ion source 100 appears in FIGS. 1A and 1B. Specifically, the term "front" shall refer to a side of the ion source 100 nearer the top of the page in FIGS. 1A and 1B, and the term "rear" shall refer to a side of the ion source 100 nearer the bottom of the page in FIGS. 1A and 1B. Said terminology will include the words specifically mentioned, derivatives thereof, and words of similar import.

The ion source 100 may include, among other components, a chamber housing 102 having a first sidewall 104, a second sidewall 106, and an extraction plate 108 coupled to the first and/or second sidewalls 104, 106. The extraction plate 108 may include one or more extraction slits or apertures 110. The chamber housing 102 may further include a base wall 112 having one or more gas inlets 114 in a rear thereof, opposite the extraction aperture 110. The present disclosure is not limited in this regard, and in various alternative embodiments the ion source 100 may include one or more gas inlets located in any of the first sidewall 104, the second sidewall 106, the extraction plate 108, and/or the base wall 112. Together, the first sidewall 104, the second sidewall 106, the extraction plate 108, and the base wall 112 of the chamber housing 102 may define an ion source chamber 116.

In some embodiments, the extraction plate 108 may be made of electrically conducting material, such as doped Si, doped SiC, aluminum, graphite, molybdenum, tantalum or tungsten. The present disclosure is not limited in this regard.

As shown, a single-slot tubular cathode 120 (hereinafter "the tubular cathode 120") may be disposed within the ion source chamber 116 and may extend between the first sidewall 104 and the second sidewall 106. In various embodiments, the tubular cathode 120 may be electrically isolated from the first sidewall 104 and the second sidewall 106. In various embodiments, the tubular cathode 120 may include a cup 124 containing a filament 126, and a tubular (or open cylindrical) main body 128 coupled at a first end 130 to the cup 124. More specifically, the cup 124 may include a first end 127 extending through the first sidewall 104 and coupled to a cathode holder 105, and a second end 129 extending into an interior 131 of the main body 128 and secured in place using any variety of means. A second end 132 of the main body 128 may be coupled to a repeller 134. As shown, the repeller 134 may include a repeller head 135 extending from a shaft 137. More specifically, the shaft 137 may extend through the second sidewall 106 and may be coupled to a repeller holder 107 and may be electrically isolated from the second sidewall 106. As shown, the repeller head 135 may be positioned within the interior 131 of the tubular cathode 120 and secured in place using a variety of means. In certain embodiments, the shaft 137 may be held in place by a clamp 133 on the exterior of the ion source chamber 116. The shaft 137 may have a smaller cross-sectional area than the repeller head 135, wherein the repeller head 135 provides a biased surface to confine the electrons. The shaft 137 is further intended to provide mechanical support and electrical conductivity to the clamp 133.

The main body 128 of the tubular cathode 120 may include a slot or opening 138 formed in a front-facing semi-cylindrical portion of the main body 128 nearest the extraction plate 108 (also referred to herein as the "front half" of the main body). A rear-facing semi-cylindrical portion of the tubular cathode 120 furthest from the extraction plate 108 (also referred to herein as the "rear half" of the main body 128) is closed. The opening 138 may be generally aligned with the extraction aperture 110 in a confronting relationship therewith. As will be described in greater detail below, the feed gas supplied to the ion source chamber 116 via the gas inlet 114 may be ionized in the tubular cathode 120. In various embodiments, the feed gas may be supplied in the form of hydrides and fluorides. For example, the ion source 100 may be employed for ion implantation of molecular, dimer, and tetramer species derived from a hydride-containing precursor species. Examples of hydride species used as precursors for ions generated by the ion source 100 include $PH_3$ and $AsH_3$ among other species. Examples of fluoride species used as precursors for ions generated by the ion source 100 include $BF_3$ and $PF_3$ among other species. The embodiments of the present disclosure are not limited in this context. In a specific, non-limiting example, $BF_2^+$ species ions may be generated by a $BF_3$ feed gas.

Figure 2:
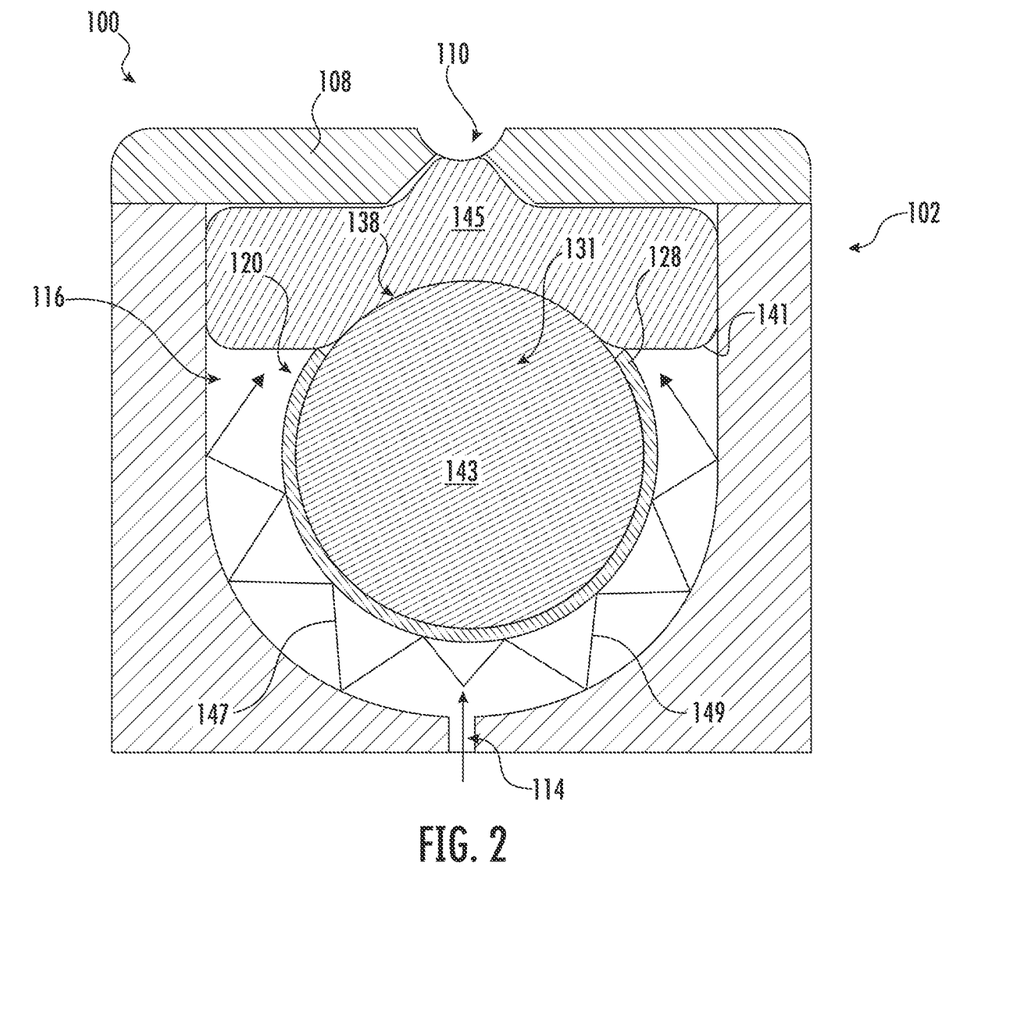
FIG. 2 is an axial cross-sectional view of the ion source shown in FIG. 1A during operation.

Referring to FIG. 2, an axial cross-sectional view illustrating the ion source 100 during use is shown. As depicted, the feed gas may be introduced into the ion source chamber 116 via the gas inlet 114 and an arc plasma 141 may be generated within the interior 131 of the main body 128 of the tubular cathode 120 when a potential difference (voltage) is applied between the tubular cathode 120 and the chamber housing 102. The plasma 141 generated within the interior 131 of the main body 128 is expanded towards the extraction aperture 110 through the opening 138. In some embodiments, and with reference to FIG. 1A, the first sidewall 104, the second sidewall 106, the extraction plate 108, and the base wall 112 of the chamber housing 102 are at a same electrical potential. Furthermore, the cup 124, the tubular cathode 120, the clamp 133, and the repeller 134 are electrically connected to one another and are at a same electrical potential. The ion source 100 may be coupled to various conventional components not depicted for clarity, including power supplies for the tubular cathode 120 and the filament 126.

As shown, the plasma 141 may have two distinct regions: a hot plasma region 143 located primarily within the main body 128 and having relatively high electron temperatures; and a cold plasma region 145 located primarily outside of the main body 128, adjacent the extraction aperture 110, and having relatively low electron temperatures. Since the main body 128 has a single, front-facing opening 138 and does not have any rear-facing openings or apertures (e.g., no openings or apertures formed in a rear semi-cylindrical portion of the main body 128), the feed gas introduced into the ion source chamber 116 at the rear of the chamber housing 102 is channeled around the exterior of the main body 128 to the front portion of the ion source chamber 116 where the feed gas is ionized in the cold plasma region 145. Thus, the main body 128 largely shields the feed gas from exposure to the hot plasma region 143 located within the main body 128, where the molecules of the feed gas could otherwise be fragmented by energetic electrons in the hot plasma and thus less likely to form desired ion species (e.g., $BF_2^+$, $P_2^+$, $P_4^+$). The formation of desired molecular beam currents (e.g., $BF_2^+$, $P_2^+$ and $P_4^+$ beam currents) is thus enhanced relative to conventional ion sources wherein feed gases are flowed directly through regions of hot plasma. Additionally, as the feed gas migrates from the gas inlet 114 to the cold plasma region 145, the molecules of the feed gas may collide with the exterior surface of the main body 128 and the interior surfaces of the chamber housing 102 as indicated by the arrows 147, 149. These collisions may produce thermal reactions (thermal dissociations) in the gas molecules and may result in the formation of dimers and tetramers.

Figure 3:
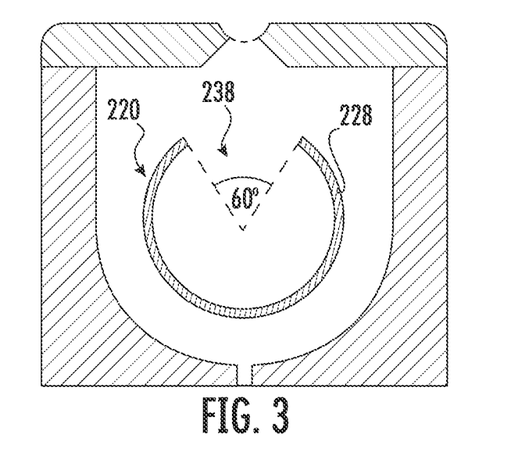
FIG. 3-5 are axial cross-sectional views of the ion source shown in FIG. 1A with alternative tubular cathode configurations.
Figure 4:
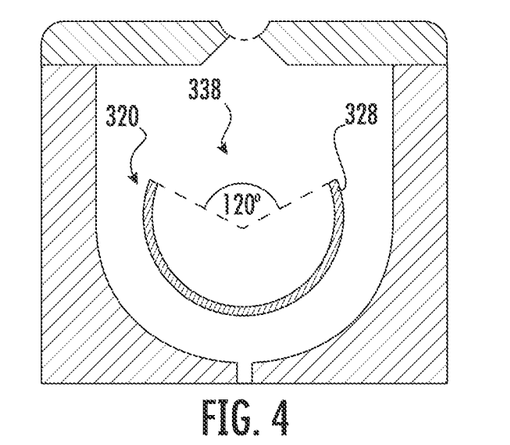
Figure 5:
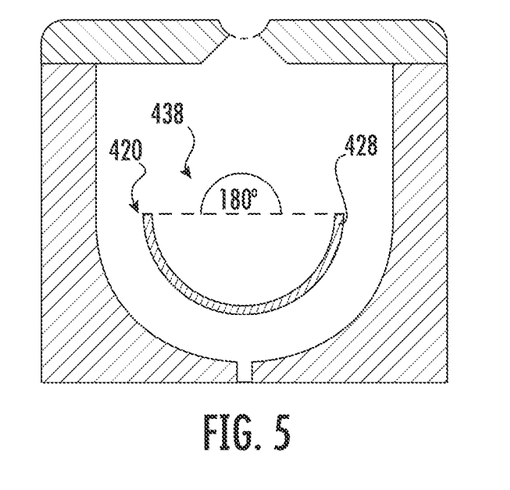

In various embodiments, the opening 138 may have an angular size in a range of 10 degrees to 180 degrees relative to the axial cross-section of the main body 128. For example, as shown in FIG. 1B, the opening 138 may have an angular size of 90 degrees. In other specific examples, FIGS. 3-5 depict tubular cathodes 220, 320, 420 having main bodies 228, 328, 428 with slots or openings 238, 338, 438 having angular sizes of 60 degrees, 120 degrees, and 180 degrees, respectively. The present disclosure is not limited in this regard.

Figure 6:
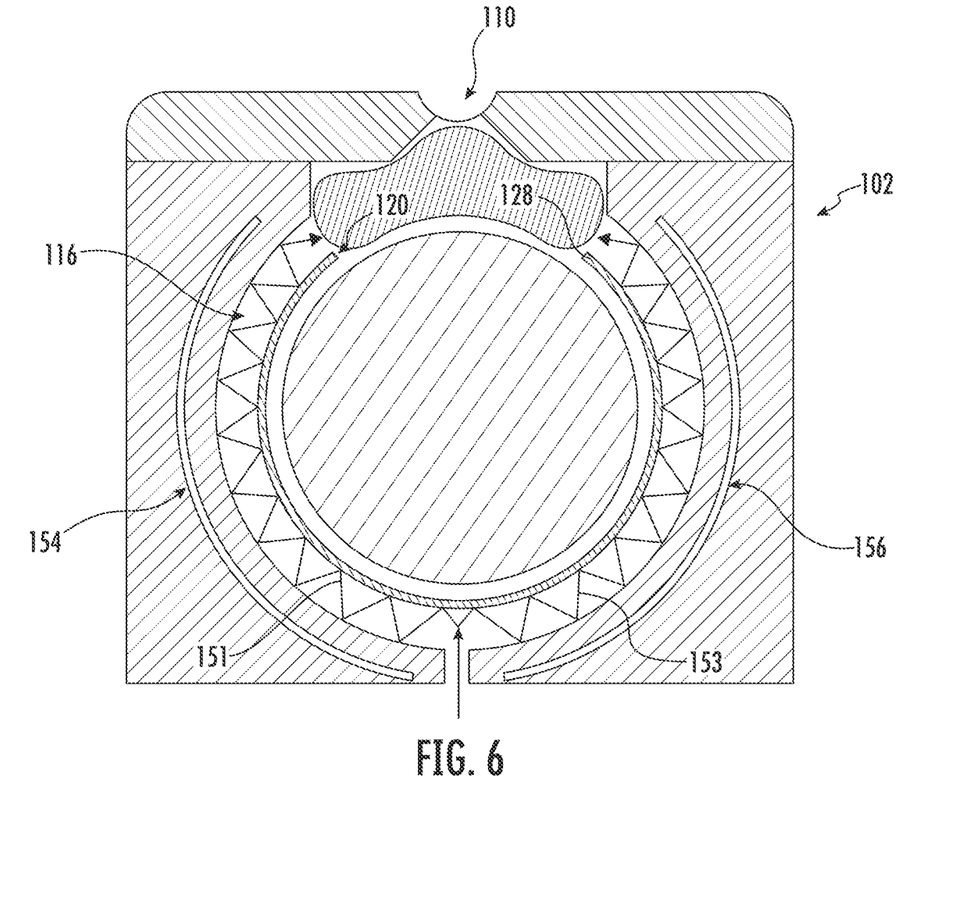
FIG. 6 is an axial cross-sectional view of the ion source shown in FIG. 1A with alternative tubular cathode and chamber housing configurations.

Referring to FIG. 6, the configuration of the tubular cathode 120 and the chamber housing 102 may be varied to tune or optimize molecular ion species formation relative to the configuration shown in FIG. 2. For example, a radial distance between the exterior surface of the main body 128 and the interior surfaces of the chamber housing 102 may be reduced relative to the configuration shown in FIG. 2 to increase the frequency of collisions between feed gas molecules and the exterior surface of the main body 128 and the interior surfaces of the chamber housing 102 (as indicated by arrows 151, 153) to further enhance the formation of dimers and tetramers. For example, the radial distance between the exterior surface of the main body 128 and the interior surfaces of the chamber housing 102 may be in a range of 1 millimeter and 5 millimeters. The present disclosure is not limited in this regard. Additionally, the distance between the main body 128 and the extraction aperture 110 may be reduced relative to the configuration shown in FIG. 2 to reduce the loss of molecular ion species therebetween. For example, a shortest distance between the main body 128 and the extraction aperture 110 may be in a range of 2 millimeters and 10 millimeters. Still further, thermal breaks 154, 156 may be incorporated into the chamber housing 102 adjacent the ion source chamber 116 to help maintain consistently high temperatures at the interior surfaces of the chamber housing 102. This may promote thermal dissociation of gas molecules colliding with the interior surfaces of the chamber housing 102. In various embodiments, the thermal breaks 154, 156 may be voids or other thermally insulating barriers formed or disposed in the chamber housing 102 adjacent the ion source chamber 116.

Figure 7:
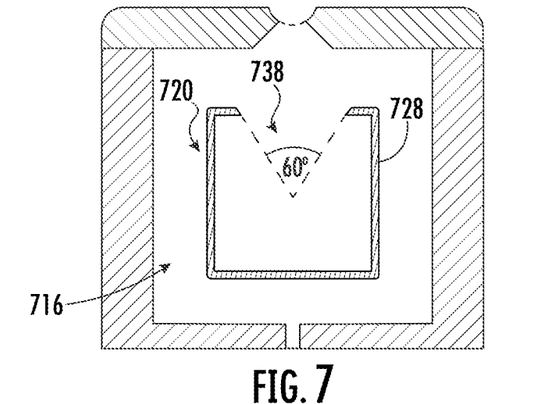
FIG. 7-9 are axial cross-sectional views of the ion source shown in FIG. 1A with alternative tubular cathode configurations.
Figure 8:
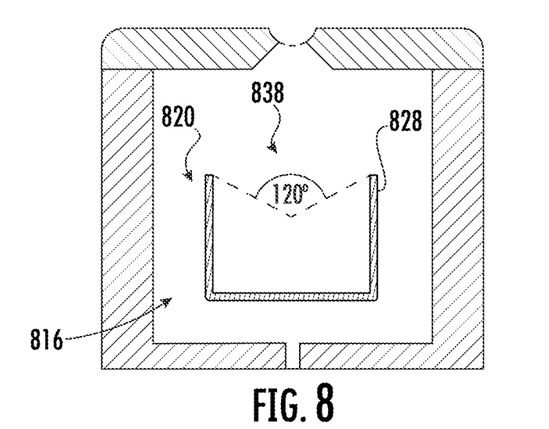
Figure 9:
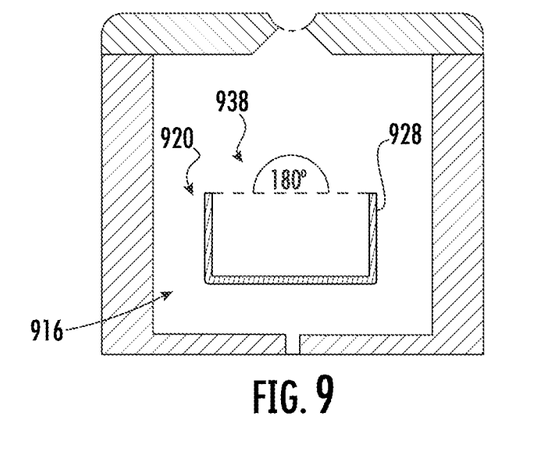

In the examples provided above, the main body 128 of the tubular cathode 128 has been described as having a circular cross-sectional shape. In various alternative embodiments, the main body 128 may have cross-sectional shapes other than circular. For example, FIGS. 7-9 depict tubular cathodes 720, 820, 920 having main bodies 728, 828, 928 with rectangular cross-sectional shapes. Notably, the having main bodies 728, 828, 928 may be disposed within respective ion source chambers 716, 816, 916 having corresponding rectangular cross-sectional shapes. The present disclosure is not limited in this regard.

The main bodies 728, 828, 928 may be provided with slots or openings 738, 838, 938 having angular sizes of 60 degrees, 120 degrees, and 180 degrees, respectively, relative to the axial cross-sections of the main bodies 728, 828, 928 (i.e., wherein the angles are defined relative to axes of the main bodies 728, 828, 928). As in the main body 128 described above, the openings 738, 838, 938 are formed in front halves of the main bodies 728, 828, 928 (i.e. the halves of the main bodies 728, 828, 928 nearest the extraction plate 108), while the rear halves of the main bodies 728, 828, 928 (i.e. the halves of the main bodies 728, 828, 928 furthest from the extraction plate 108) are closed. In various alternative embodiments, the main body of the tubular cathode may have cross-sectional shapes other than circular or rectangular, including and not limited to, triangular, pentagonal, hexagonal, irregular, etc. The present disclosure is not limited in this regard.

Figure 10:
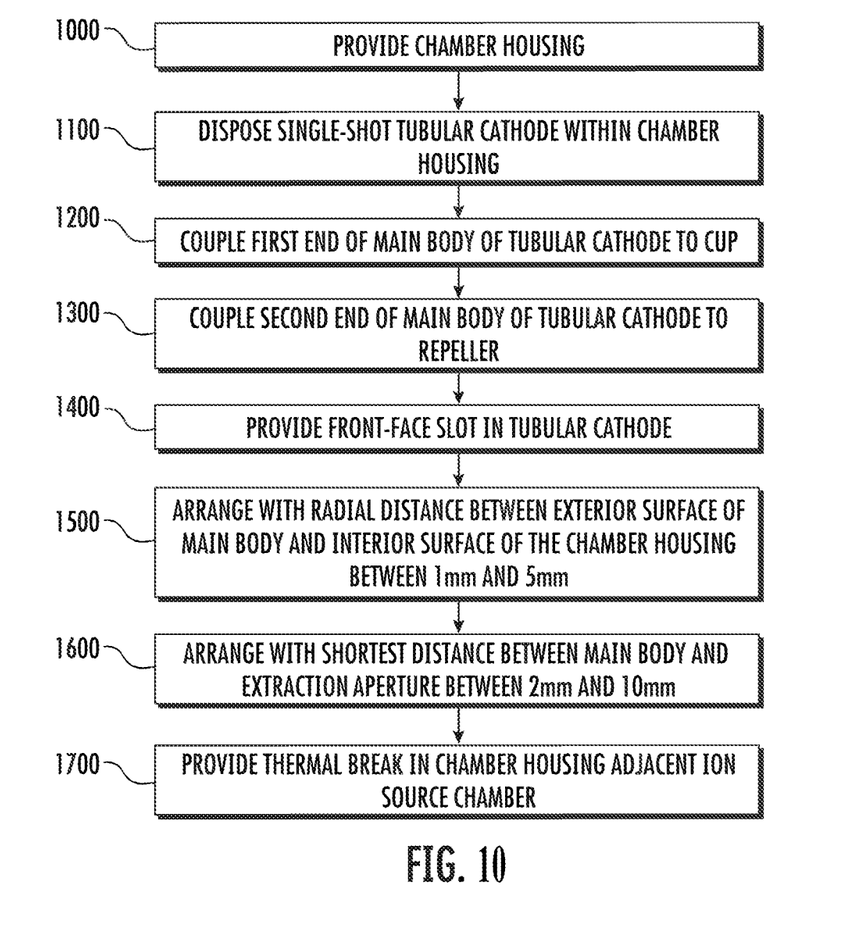
FIG. 10 is a flow diagram illustrating a method of manufacturing a ion source in accordance with an exemplary embodiment of the present disclosure.

Referring to FIG. 10, a flow diagram illustrating an exemplary method for manufacturing an ion source in accordance with the present disclosure is shown. The method will now be described in conjunction with the embodiments of the present disclosure shown in FIGS. 1A-6.

At block 1000 of the exemplary method, a chamber housing 102 having a first sidewall 104, a second sidewall 106, and an extraction plate 108 coupled to the first and/or second sidewalls 104, 106 may be provided. The extraction plate 108 may include one or more extraction slits or apertures 110. The chamber housing 102 may further include a base wall 112 having one or more gas inlets 114 in a rear thereof, opposite the extraction aperture 110. The present disclosure is not limited in this regard, and in various alternative embodiments the ion source 100 may include one or more gas inlets located in any of the sidewall 104, the sidewall 106, the extraction plate 108, and/or the base wall 112. Together, the first sidewall 104, the second sidewall 106, the extraction plate 108, and the base wall 112 of the chamber housing 102 may define an ion source chamber 116.

In some embodiments, the extraction plate 108 may be made of electrically conducting material, such as doped Si, doped SiC, aluminum, graphite, molybdenum, tantalum or tungsten. The present disclosure is not limited in this regard.

At block 1100 of the exemplary method, a single-slot tubular cathode 120 (hereinafter "the tubular cathode 120") may be disposed within the ion source chamber 116 and may extend between the first sidewall 104 and the second sidewall 106. In various embodiments, the tubular cathode 120 may be electrically isolated from the first sidewall 104 and the second sidewall 106. At block 1200 of the method, a first end 130 of a tubular (or open cylindrical) main body 128 of the tubular cathode 120 may be coupled to a cup 124 containing a filament 126. More specifically, a first end 127 of the cup 124 may be extended through the first sidewall 104 and coupled to a cathode holder 105, and a second end 129 of the cup 124 may be extended into an interior 131 of the main body 128 and secured in place using any variety of means. At block 1300 of the method, a second end 132 of the main body 128 may be coupled to a repeller 134. As shown, the repeller 134 may include a repeller head 135 extending from a shaft 137. More specifically, the shaft 137 may be extended through the second sidewall 106 and may be coupled to a repeller holder 107 and may be electrically isolated from the second sidewall 106. As shown, the repeller head 135 may be positioned within the interior 131 of the tubular cathode 120 and secured in place using a variety of means. In certain embodiments, the shaft 137 may be held in place by a clamp 133 on the exterior of the ion source chamber 116. The shaft 137 may have a smaller cross-sectional area than the repeller head 135, wherein the repeller head 135 provides a biased surface to confine the electrons. The shaft 137 is further intended to provide mechanical support and electrical conductivity to the clamp 133.

At block 1400 of the exemplary method, the main body 128 of the tubular cathode 120 may be provided with a opening 138 formed in a front-facing semi-cylindrical portion of the main body 128 nearest the extraction plate 108. The opening 138 may be generally aligned with the extraction aperture 110 in a confronting relationship therewith. In various embodiments, the opening 138 may have an angular size in a range of 10 degrees to 180 degrees relative to the circular cross-section of the main body 128. For example, as shown in FIG. 1B, the opening 138 may have an angular size of 90 degrees. In other specific examples, FIGS. 3-5 depict tubular cathodes 220, 320, 420 having main bodies 228, 328, 428 with slots or openings 238, 338, 438 having angular sizes of 60 degrees, 120 degrees, and 180 degrees, respectively. The present disclosure is not limited in this regard.

At block 1500 of the exemplary method, the configuration of the tubular cathode 120 and the chamber housing 102 may be varied to tune or optimize molecular ion species formation relative to the configuration shown in FIG. 2. For example, a radial distance between the exterior surface of the main body 128 and the interior surfaces of the chamber housing 102 may be varied to increase the frequency of collisions between feed gas molecules and the exterior surface of the main body 128 and the interior surfaces of the chamber housing 102 (as indicated by arrows 151, 153) to further enhance the formation of dimers and tetramers. For example, the radial distance between the exterior surface of the main body 128 and the interior surfaces of the chamber housing 102 may be in a range of 1 millimeter and 5 millimeters. The present disclosure is not limited in this regard. Additionally, at block 1600 of the exemplary method, the distance between the main body 128 and the extraction aperture 110 may be varied to reduce the loss of molecular ion species therebetween. For example, a shortest distance between the main body 128 and the extraction aperture 110 may be in a range of 2 millimeters and 10 millimeters.

At block 1700 of the exemplary method, the chamber housing 102 may be provided with thermal breaks 154, 156 adjacent the ion source chamber 116 to help maintain consistently high temperatures at the interior surfaces of the chamber housing 102. This may promote thermal dissociation of gas molecules colliding with the interior surfaces of the chamber housing 102. In various embodiments, the thermal breaks 154, 156 may be provided as voids or other thermally insulating barriers formed or disposed in the chamber housing 102 adjacent the ion source chamber 116.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In view of the foregoing, at least the following advantages are achieved by the embodiments disclosed herein. A first advantage of the ion source 100 described herein is the facilitation of larger beam currents of atomic species, such as phosphorous, for a given extraction current, relative to ion sources having conventional cathode arrangements. A second advantage of the ion source 100 described herein is longer maintenance intervals. A third advantage of the ion source 100 described herein is the provision of a smaller plasma volume since the plasma is generally confined within the tubular cathode 120 rather than filling the entire volume of the ion source chamber 116. A fourth advantage is more efficient operation due to a shorter distance between the tubular cathode and the extraction aperture 110.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion source comprising:
a chamber housing defining an ion source chamber and including an extraction plate on a front side thereof, the extraction plate having an extraction aperture formed therein; and
a tubular cathode having a rectangular cross-sectional shape disposed within the ion source chamber and having an opening formed in a front half thereof nearest the extraction aperture, wherein a rear half of the tubular cathode furthest from the extraction aperture is closed.

2. The ion source of claim 1, wherein the tubular cathode includes a main body having a first end coupled to a cup containing a filament and a second end coupled to a repeller.

3. The ion source of claim 2, wherein the cup extends through a sidewall of the chamber housing and is coupled to a cathode holder.

4. The ion source of claim 2, wherein the repeller includes a repeller head extending from a shaft, the shaft extending through a sidewall of the chamber housing and coupled to a repeller holder.

5. The ion source of claim 1, wherein the extraction plate is formed of at least one of silicon, silicon carbide, aluminum, graphite, molybdenum, tantalum and tungsten.

6. The ion source of claim 1, wherein the opening has an angular size in a range of 10 degrees to 180 degrees relative to an axial cross-section of a main body of the tubular cathode.

7. The ion source of claim 6, wherein the opening has an angular size of 60 degrees relative to the axial cross-section of the main body of the tubular cathode.

8. The ion source of claim 6, wherein the opening has an angular size of 120 degrees relative to the axial cross-section of the main body of the tubular cathode.

9. The ion source of claim 6, wherein the opening has an angular size of 180 degrees relative to the axial cross-section of the main body of the tubular cathode.

10. The ion source of claim 1, wherein a shortest distance between a main body of the tubular cathode and the extraction aperture is in a range of 2 millimeters to 10 millimeters.

11. The ion source of claim 1, further comprising a thermal break in the chamber housing adjacent the ion source chamber for mitigating temperature variations at an interior surface of the chamber housing.

12. The ion source of claim 11, wherein the thermal break comprises a void in the chamber housing.

13. An ion source comprising:
a chamber housing defining an ion source chamber and including an extraction plate on a front side thereof, the extraction plate having an extraction aperture formed therein; and
a tubular cathode disposed within the ion source chamber and having an opening formed in a front half thereof nearest the extraction aperture, wherein a rear half of the tubular cathode furthest from the extraction aperture is closed;
wherein the opening has an angular size in a range of 10 degrees to 180 degrees relative to an axial cross-section of a main body of the tubular cathode; and
wherein a shortest distance between the main body of the tubular cathode and the extraction aperture is in a range of 2 millimeters to 10 millimeters.

14. A method of manufacturing an ion source comprising:
providing a chamber housing defining an ion source chamber and including an extraction plate on a front side thereof, the extraction plate having an extraction aperture formed therein; and
disposing a tubular cathode having a rectangular cross-sectional shape within the ion source chamber, the tubular cathode having an opening formed in a front half thereof nearest the extraction aperture, the opening disposed in a confronting relationship with the extraction aperture, wherein a rear half of the tubular cathode furthest from the extraction aperture is closed.

15. The method of claim 14, further comprising coupling a first end of a main body of the tubular cathode to a cup containing a filament and coupling a second end of the main body to a repeller.

16. The method of claim 14, wherein the opening has an angular size in a range of 10 degrees to 180 degrees relative to an axial cross-section of a main body of the tubular cathode.

17. The method of claim 14, wherein a shortest distance between a main body of the tubular cathode and the extraction aperture is in a range of 2 millimeters to 10 millimeters.

18. The method of claim 14, further comprising providing a thermal break in the chamber housing adjacent the ion source chamber for mitigating temperature variations at an interior surface of the chamber housing.

* * * * *